United States Patent [19]

Kuo et al.

[11] Patent Number: 5,875,250

[45] Date of Patent: Feb. 23, 1999

[54] SINGLE PACKAGE THREE CHANNEL AUDIO SIGNAL AMPLIFIER

[76] Inventors: Mark Kuo, 900 Spring Tide Dr., Newport Beach, Calif. 92660; Evan Peng, 1587 Rancho Hills Dr., Chino Hills, Calif. 91709

[21] Appl. No.: 17,567

[22] Filed: Feb. 2, 1998

[51] Int. Cl.$^6$ .................................................. H03F 21/00
[52] U.S. Cl. ............................ 381/120; 381/81; 381/80
[58] Field of Search ............................... 381/120, 77, 80, 381/81, 123

[56] References Cited

U.S. PATENT DOCUMENTS

| | | |
|---|---|---|
| 4,092,552 | 5/1978 | Hoehn . |
| 4,481,660 | 11/1984 | de Koning ................................ 381/81 |
| 4,490,683 | 12/1984 | Rhee ..................................... 381/120 |
| 4,641,108 | 2/1987 | Gill, Jr. . |
| 4,827,221 | 5/1989 | Botti et al. . |
| 4,875,020 | 10/1989 | Daniele et al. . |
| 4,879,526 | 11/1989 | Botti et al. . |
| 5,488,669 | 1/1996 | Zampini ................................. 381/120 |
| 5,586,194 | 12/1996 | Risch . |

*Primary Examiner*—Minsun Oh Harvey
*Attorney, Agent, or Firm*—Dennis W. Beech

[57] ABSTRACT

The single package three channel audio signal amplifier has three amplifier channels which may be used independently to power three output loads or audio speakers or may be paralleled or bridged to increase power to one or two output loads. The integrated circuit is particularly useful for current computers which use audio devices that require signals to be processed by computer circuit boards that have power limitations. The signal amplifier allows switching between one, two and three channel operation. In addition the new device uses class D operation amplifiers which are coupled to the load by ratio transformers to provide increased efficiency and gain. The device has internal limiting and preamplifier control; allows volume adjustment, filter level and range selection, and mute and treble control; and provides on-device voltage regulation.

2 Claims, 8 Drawing Sheets

SINGLE PACKAGE THREE CHANNEL AUDIO SIGNAL AMPLIFIER

BACKGROUND OF THE INVENTION

1. Field of the Invention

This invention relates to electronic devices for power amplification and more particularly to audio signal amplification. The new device provides for a combination of at least three selectable amplifier channels in a single integrated circuit package to allow use as a one, two or three channel amplifier device with varying output power based on the mode selected.

2. Description of Related Art

Use of independent amplifiers, basically in two channel configurations such as found in stereo systems, to form a bridging two channel amplifier are known in the art. This type of circuit for use in audio systems has often been used. This is particularly true in audio systems where power supply limitations exist and where inexpensive circuitry is desired yet a more powerful audio sound output is needed.

More recently such two channel bridging circuit have been used with computer sound cards. In these applications the computer sound card amplifying capabilities are limited by the computer power management scheme. In such instances the computer sound card amplifier is bridged with an external audio amplifier to power a speaker. By properly selecting and balancing the components the bridging circuit configuration can approximately double the speaker power output as for example as described in U.S. Pat. No. 5,586,194.

Use of independent and bridged power amplifiers includes development of devices with paired amplifiers which may be switched by external control from independent operation for stereo operation to bridged operation for increased single speaker output audio power. By proper design of integrated circuit elements a device which uses the same minimum connecting pin leads as existing two channel independent operation devices has been formulated.

More modernly the need for additional audio output power in the limited computer supply power environment has been created by the development of computer multimedia devices such as CD-ROM and DVD players. These computer multimedia devices provide quality grade audio music if they are coupled with an adequate audio power and speaker system.

The present invention includes a three channel signal amplifier in a single package which may be used in a three channel audio power amplifier to support for example surrounding sound effect speaker systems which require three independent amplifier channels. The integrated circuit device contains control circuitry to allow use of the device in the 3 channel mode or in 2 channel and 1 channel modes to provide increased output power to fewer speakers.

The typical class A or class AB operation amplifier can only normally achieve efficiencies of less than 60% on average. Therefore in the instant invention class D operation amplifiers are implemented which are balance bridge connected and transformer coupled to the output load or speakers. In this configuration the class D amplifier can theoretically achieve more than 85% efficiency.

SUMMARY OF THE INVENTION

One object of the present invention is to allow selection of three, two and one channel power amplification in a single package integrated circuit. Another object is to parallel couple amplifier channels when reduced channels are used to provide increased power to the output load. A further object increases potential output power by use of class D operation amplifiers which are transformer coupled to the output load.

In accordance with the description presented herein, other objectives of this invention will become apparent when the description and drawings are reviewed.

DESCRIPTION OF THE PREFERRED EMBODIMENT

Figure 1A:
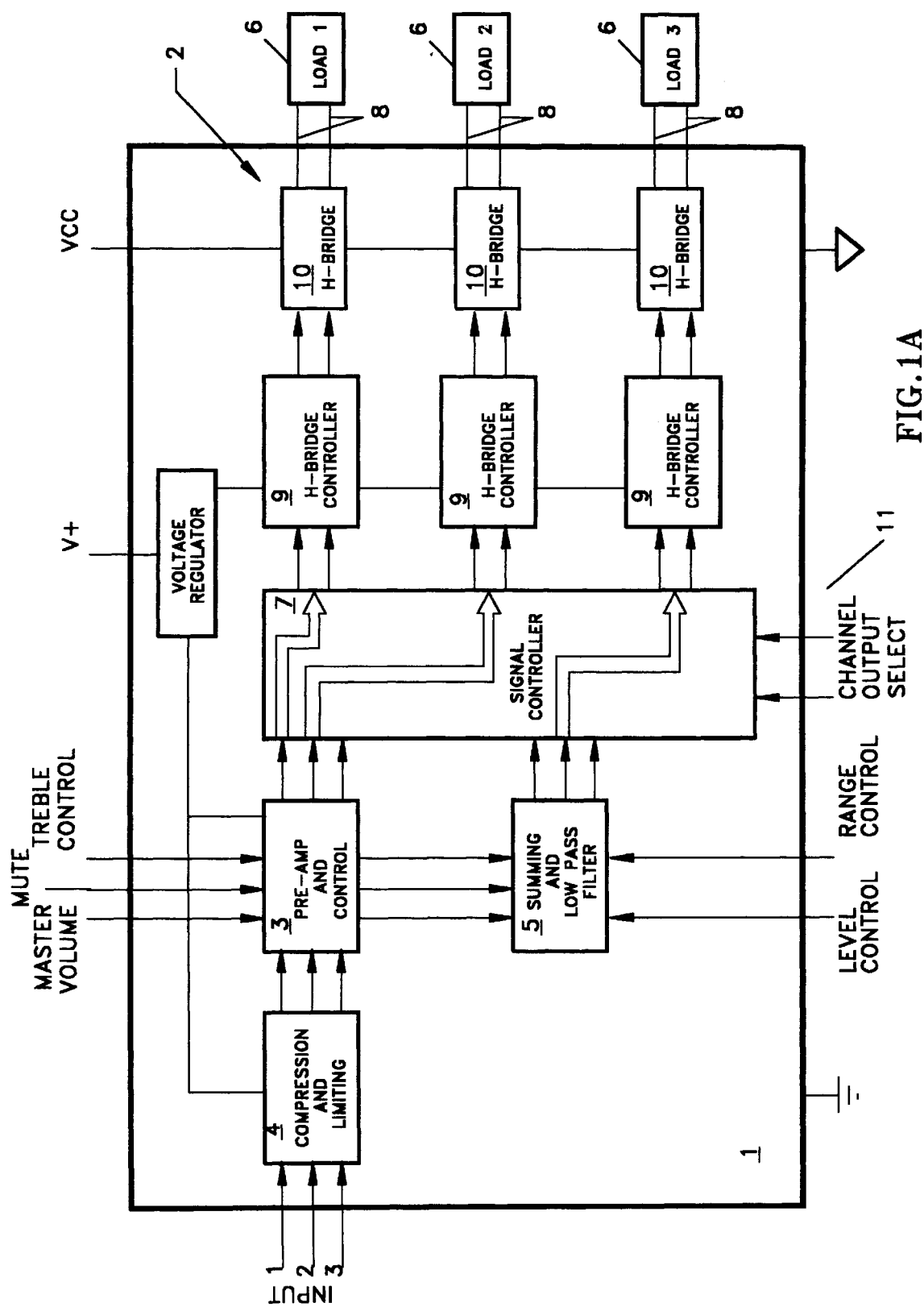
FIGS. 1a through 1g illustrate functional block diagrams of the integrated circuit with interface connections in the various modes.

Referring to FIG. 1a the single package three channel audio signal amplifier (1) has three amplifier channels (2) with an input preamplifier (3) stage having 3 preamplifiers and having a compression and limiting input (4) to control input signal characteristics. A summing and low-pass filter (5) receives signals from the preamplifier (3) to provide low range signal characteristics to selected amplifier channels.

The signal selection for the output load (6) is accomplished by setting of the signal controller (7) and where necessary, paralleling output signal paths (8). The three amplifier channels (2) are comprised of identical H-bridge controllers (9) and H-bridges (10). As illustrated in FIG. 1a, the signal controller (7) has been set by the external channel out select (11) control pins to distribute two mid-to-high range signals to two amplifier channels (2). A third low range signal is routed to the remaining amplifier channel (2).

The control of volume, mute and treble is accomplished with external leads connected to the preamplifier (3). Signal level and range are controlled by external leads connected to the summing and low pass filter (5). Typical external voltage supply leads are provided as illustrated in the figure.

Figure 1B:
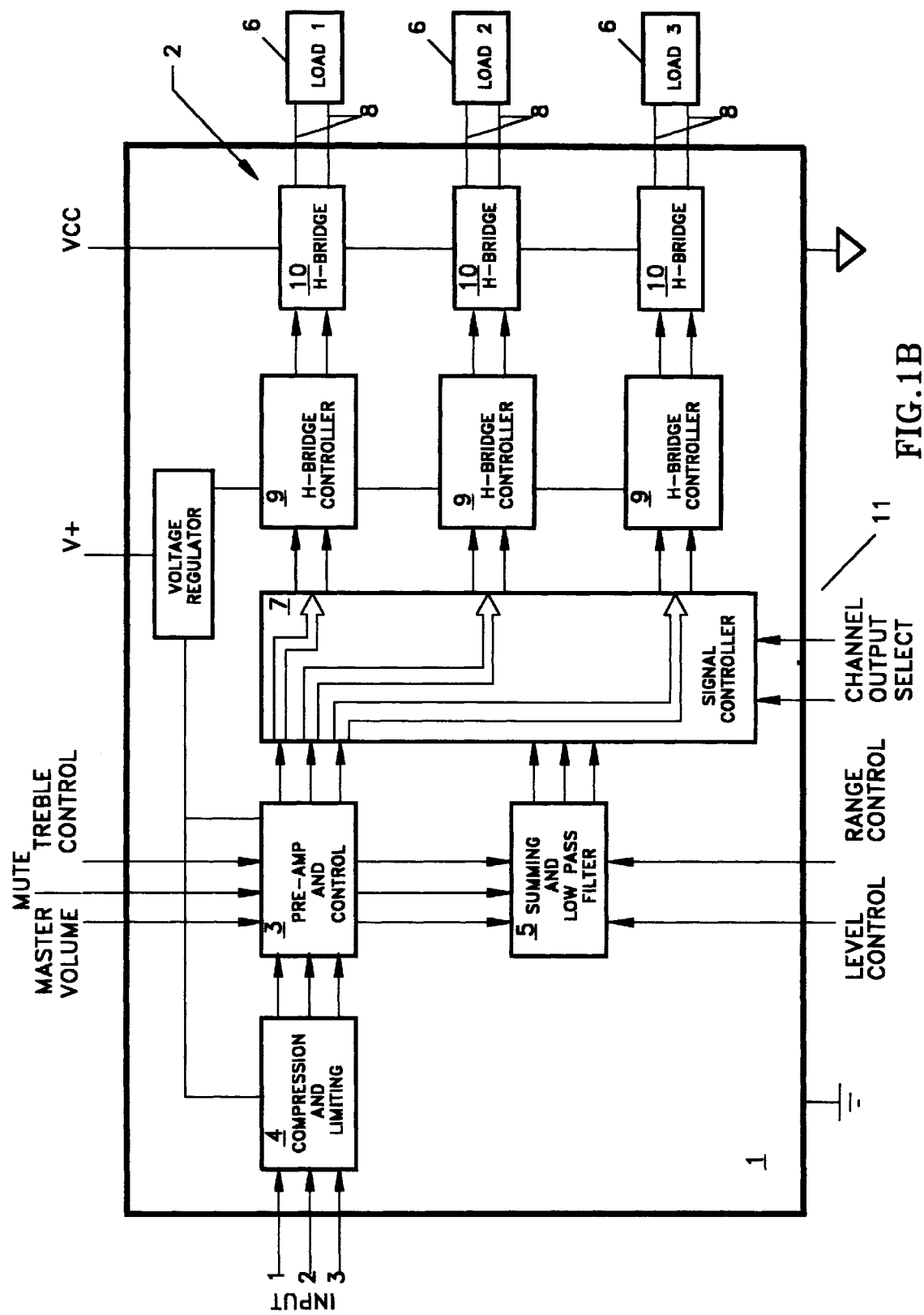
Figure 1C:
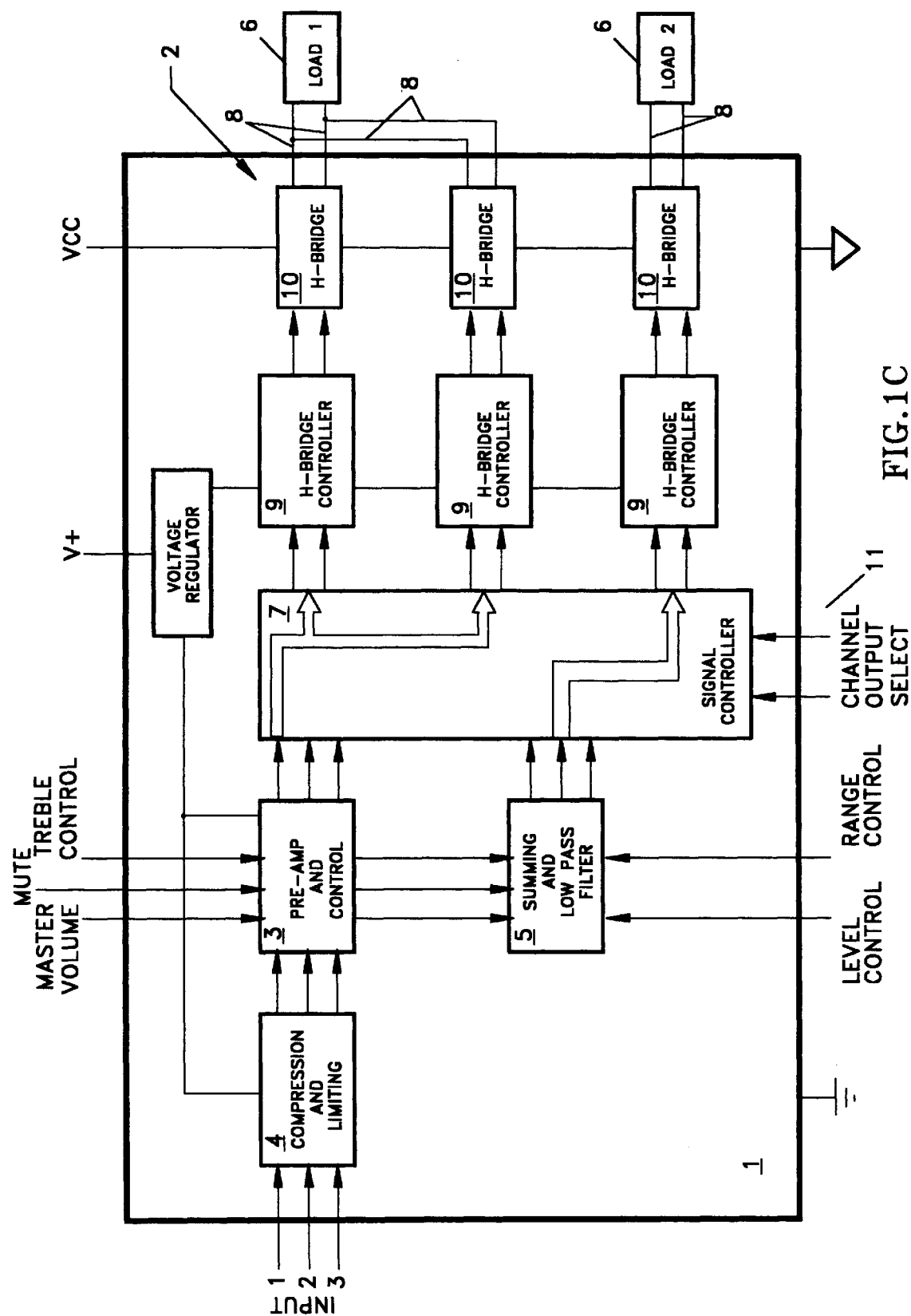

Referring to FIGS. 1b through 1g, alternate signal selection configurations are illustrated using a combination of signal distribution settings for the signal controller (7) and where required parallel connection of output signal paths (8). FIG. 1b provides three mid-to-high range signal outputs. FIG. 1c parallels two amplifier channels (2) for increased power in one mid-to-high range signal path to an output load (6) and also one low range signal to a separate output load (6).

Figure 1D:
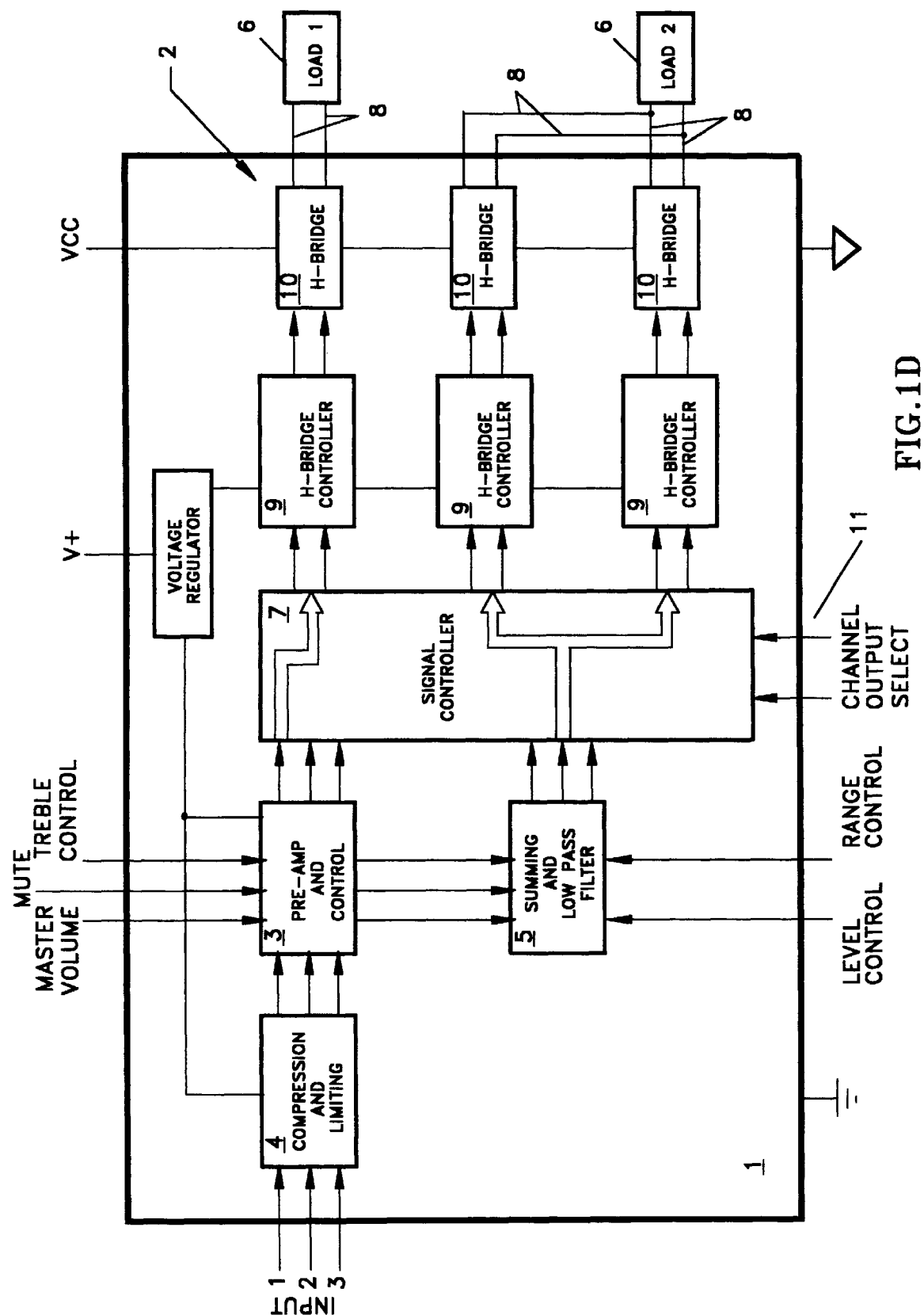
Figure 1E:
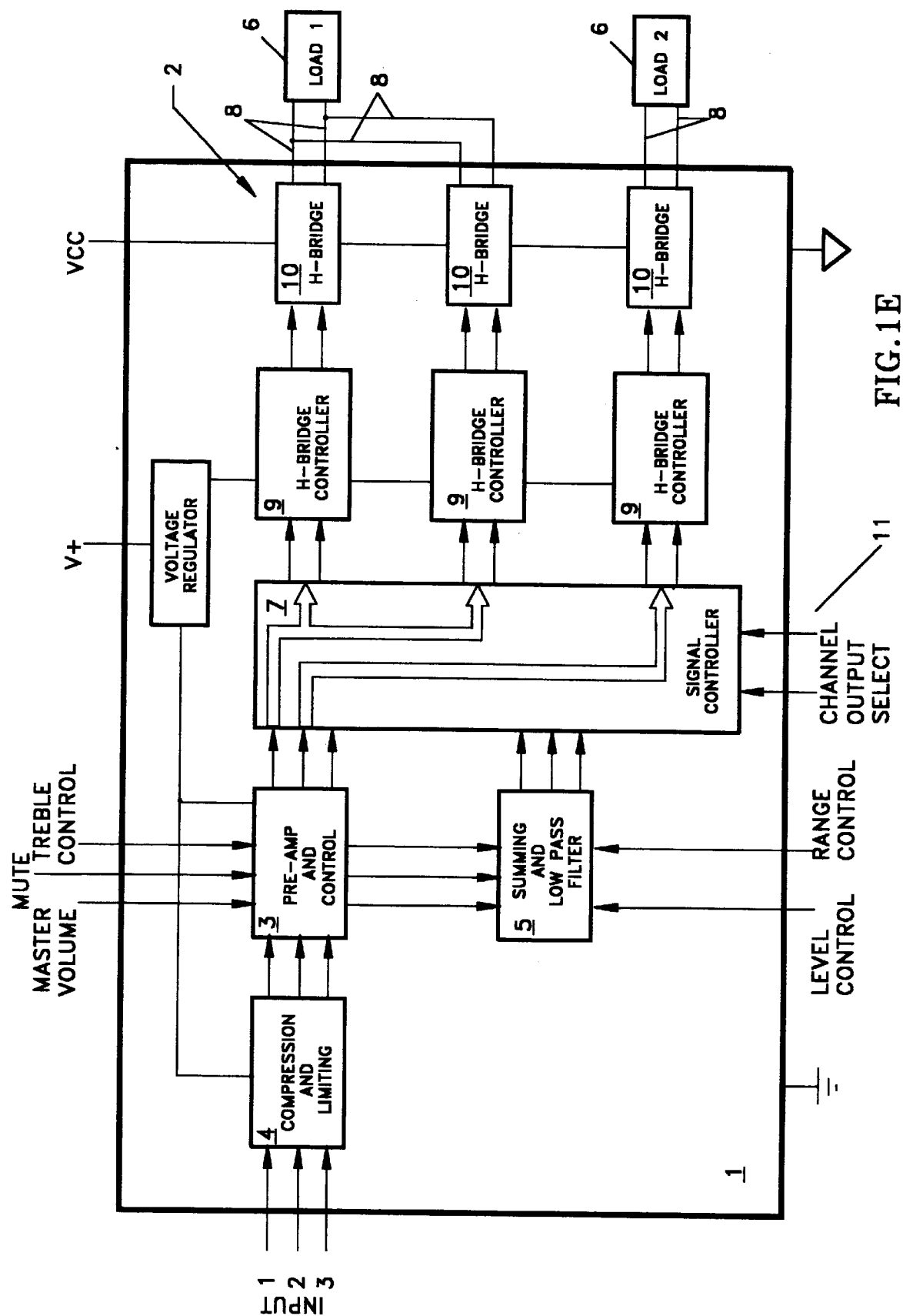

FIG. 1d reverses FIG. 1c providing parallel channels for increased output power for one low range signal and a separate mid-to-high range signal. FIG. 1e provides two mid-to-high range signals with two amplifier channels (2) paralleled for increased power to one of the two output loads (6).

Figure 1F:
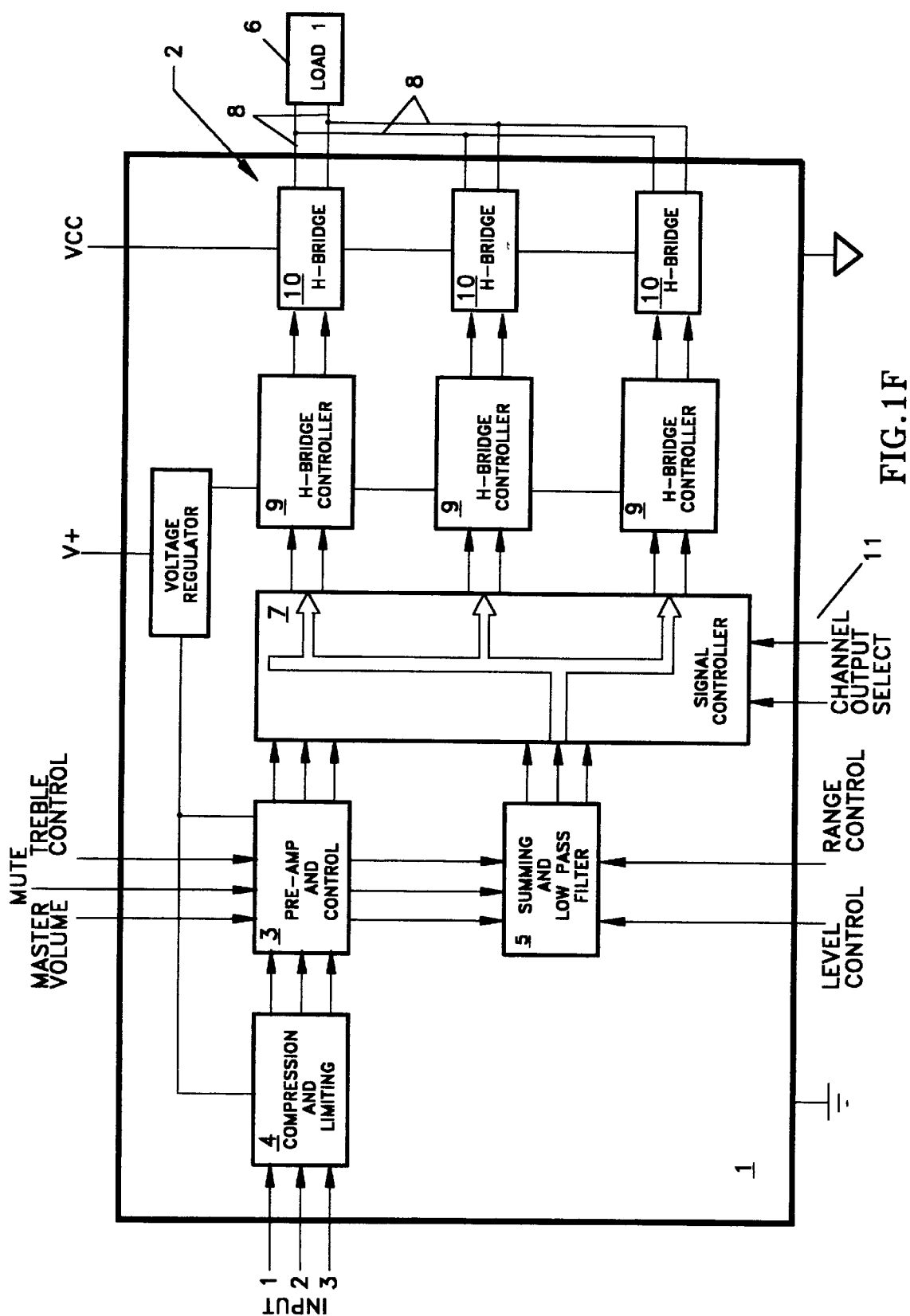
Figure 1G:
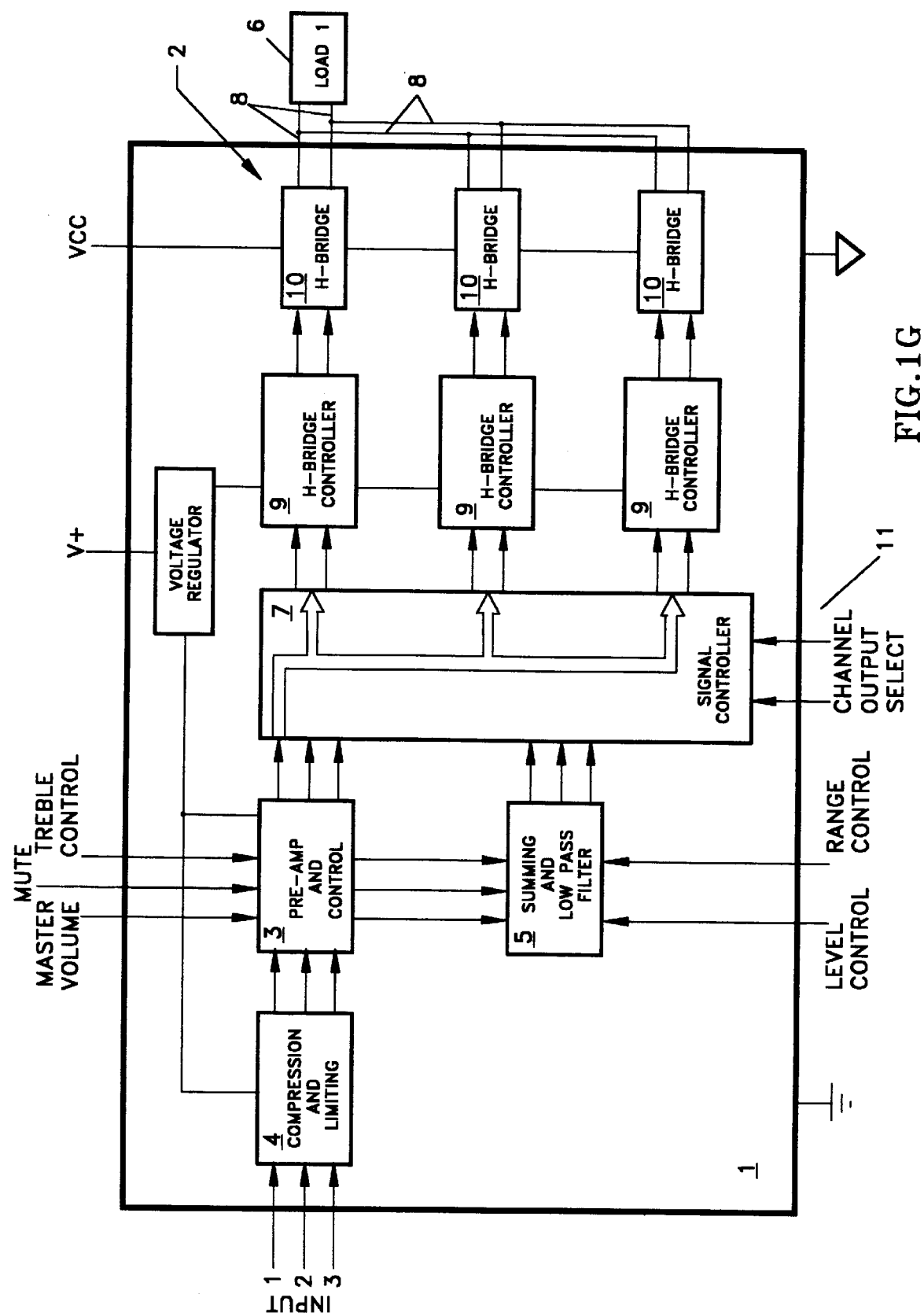
Figure 2:
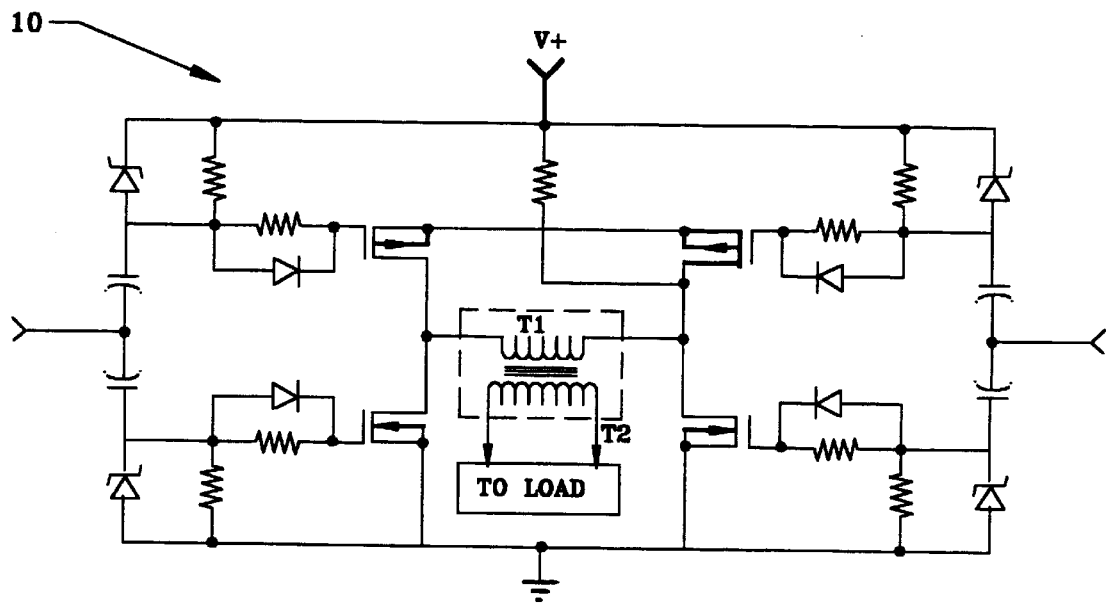
FIG. 2 illustrates a full H-bridge output circuit.
Figure 3:
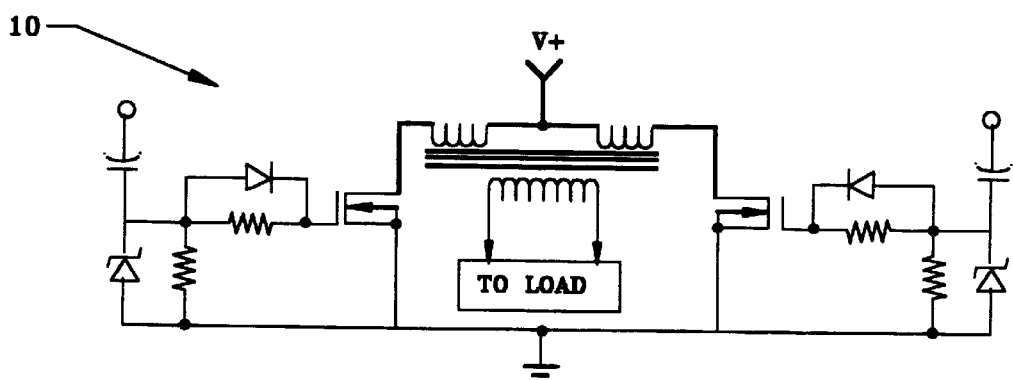
FIG. 3 illustrates a center tap transformer H-bridge output circuit.

FIGS. 1f and 1g illustrate all three amplifier channels (2) paralleled. FIG. 1f provides a maximum power output low range signal and FIG. 1g provides a maximum power output mid-to-high range signal.

The H-bridge (10) is implemented as a class D amplifier which is transformer coupled to the output load (6) which would normally be an audio speaker. The H-bridge controller (9) converts the analog signal received from the signal controller (7) to a switching signal as for example by use of a pulse width modulation conversion for use in the class D amplifier operation. The use of the class D amplifier operation allows lower voltage operation of a given amplifier channel (2) which coupled to the output load (6) by a ratio transformer provides greater unclipped output power. If further power is desired, one amplifier channel (2) may be connected as slave to a second amplifier channel (2).

The signal amplifier (1) has an internal voltage regulator (12) to protect the circuitry from external supply voltage variations.

We claim:

1. A power amplifier for multiple channel selection of power output levels comprising:

signals output from a compression and limiting input into a preamplifier wherein the preamplifier outputs signals to a signal controller and a summing and a low pass filter;

the low pass filter outputs signals to the signal controller;

three amplifier channels are connected to the signal controller output with each amplifier channel having a H-bridge controller connected to a H-bridge whose output is externally connected to an output load;

the signal controller having selectable input-to-output channels which are controlled by an external channel output select lead;

three external signal paths being bridgeable; and a voltage regulator in the power amplifier for internal voltage control.

2. The power amplifier as in claim 1 wherein the H-bridge operating as a class D amplifier which is transformer coupled to the output load.

* * * * *